(12) United States Patent
Huang

(10) Patent No.: US 7,176,387 B1
(45) Date of Patent: Feb. 13, 2007

(54) ELECTROMAGNETIC SHIELDING DEVICE

(75) Inventor: Thomas N Huang, Taoyuan (TW)

(73) Assignee: King Star Enterprise, Inc., San Gabriel, CA (US)

( * ) Notice: Subject to any disclaimer, the term of this patent is extended or adjusted under 35 U.S.C. 154(b) by 0 days.

(21) Appl. No.: 11/293,230

(22) Filed: Dec. 5, 2005

(51) Int. Cl.
*H05K 9/00* (2006.01)
*D02G 3/02* (2006.01)

(52) U.S. Cl. ........................................ 174/393; 57/210

(58) Field of Classification Search ............... 174/350, 174/352, 355, 356, 369, 378, 386, 388, 389, 174/392, 393, 394; 455/575.1, 575.8, 90.3; 57/210, 212
See application file for complete search history.

(56) References Cited

U.S. PATENT DOCUMENTS

| | | | | |
|---|---|---|---|---|
| 1,696,411 A | * | 12/1928 | Peck | 174/393 |
| 1,697,142 A | * | 1/1929 | Roller | 174/392 |
| 1,732,593 A | * | 10/1929 | Cannon | 57/210 |
| 4,126,287 A | * | 11/1978 | Mendelsohn et al. | 174/392 |
| 4,647,495 A | * | 3/1987 | Kanayama et al. | 174/393 |
| 4,678,699 A | * | 7/1987 | Kritchevsky et al. | 174/393 |
| 4,793,130 A | * | 12/1988 | Togashi et al. | 57/210 |
| 4,966,637 A | * | 10/1990 | Laborie | 174/358 |
| 5,617,713 A | * | 4/1997 | Mawick et al. | 57/210 |
| 5,632,137 A | * | 5/1997 | Kolmes et al. | 57/212 |
| 5,881,547 A | * | 3/1999 | Chiou et al. | 57/216 |
| 6,054,647 A | * | 4/2000 | Ridener | 174/392 |
| 6,222,126 B1 | * | 4/2001 | Strange et al. | 174/393 |
| 6,855,883 B1 | * | 2/2005 | Matsui | 174/393 |
| 6,957,525 B2 | * | 10/2005 | Verstraeten et al. | 57/238 |

* cited by examiner

*Primary Examiner*—Dean A. Reichard
*Assistant Examiner*—Adolfo Nino
(74) *Attorney, Agent, or Firm*—Rosenberg, Klein & Lee

(57) ABSTRACT

An electromagnetic shielding device has a bottom layer, a shielding layer and a top layer. The shielding layer is mounted between the bottom layer and the top layer and is made of metal filaments and textile fibers. The metal filaments and the textile fibers of the shielding layer are blended and formed into a mesh. The electromagnetic shielding device in the present invention may be made into patches or forms that can be adhered to electrical and electronic equipment, or adapted for use in clothing.

5 Claims, 5 Drawing Sheets

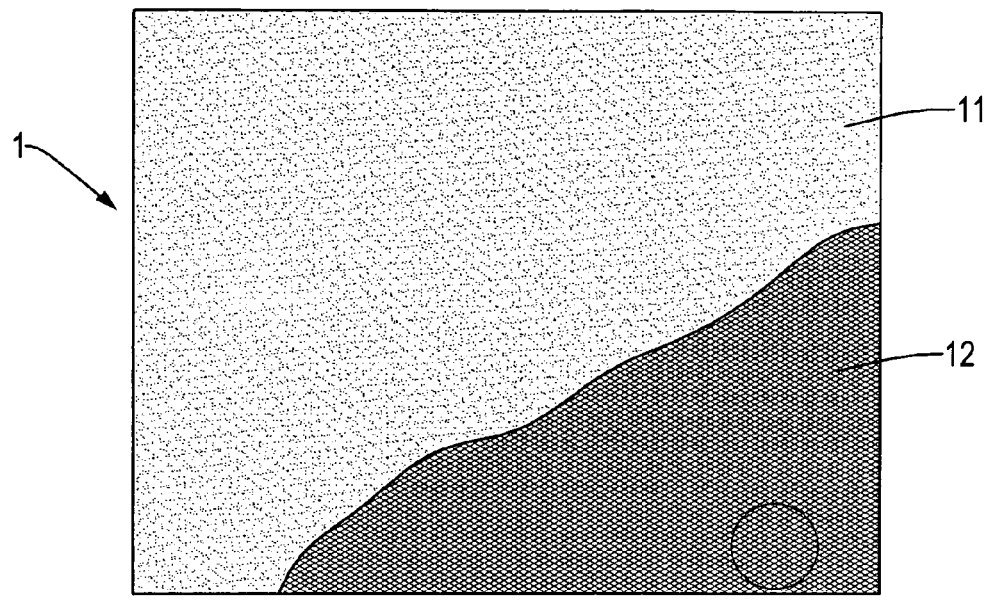
FIG.2A
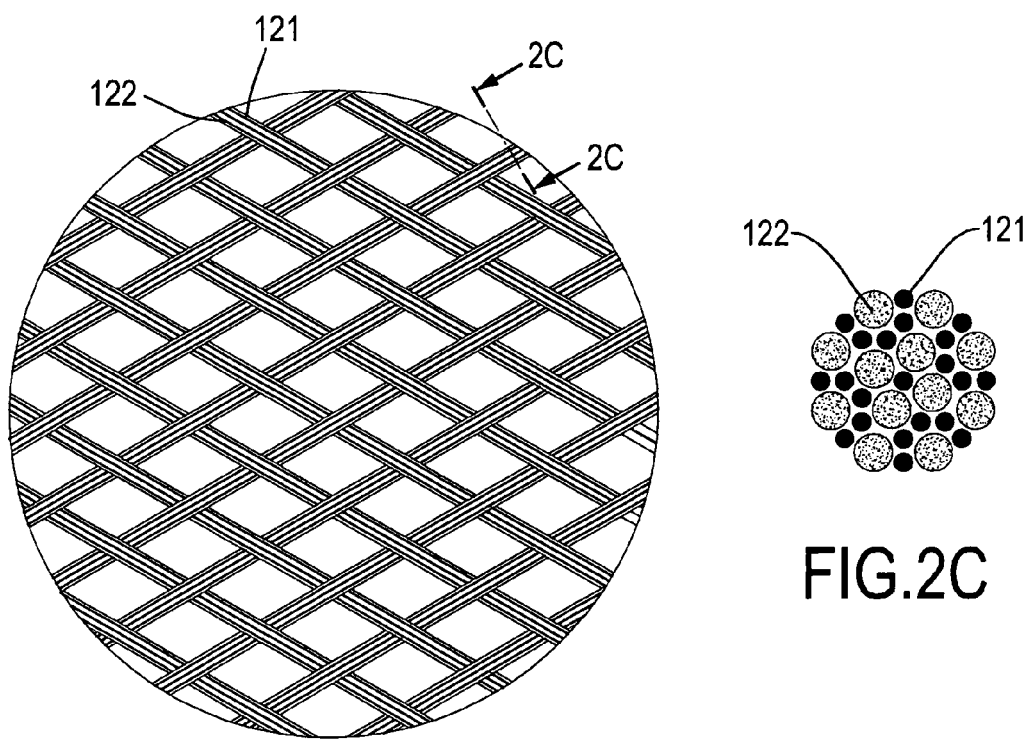
FIG.2B
FIG.2C

ELECTROMAGNETIC SHIELDING DEVICE

BACKGROUND OF THE INVENTION

1. Field of the Invention

The present invention relates to an electromagnetic shielding device, and more particularly to an electromagnetic shielding device that has a small volume and can be used in various forms.

2. Description of the Related Art

All electronic and electrical equipment generate and emit electromagnetic waves when in operation. Although there is no definitive evidence to prove that electromagnetic waves are related to cancer, it has been reported that exposure to 60 Hz or greater environments for long periods of time will cause cancer in a pregnant woman. It has been also been reported that radio broadcasters and radar operators are more susceptible to blood cancer and brain cancer. Furthermore, the Consumers Association in England has warned that the electromagnetic waves emitted by a wireless earphone of a mobile phone are three times greater than that emitted by the mobile phone itself. In short, long-term exposure to electromagnetic waves may be harmful.

Electromagnetic waves are produced by all types of electronic or electrical equipment, including computers, televisions, and even fans. Electromagnetic shielding products are available today, but have only been used for mobile phones. Conventional electromagnetic shielding products are made of conductive plastics or metal to shield electromagnetic waves. However, the cost of conductive plastics is high, so conductive plastics are not suitable for large-sized items. Further, conductive plastics and metal are hard to manufacture and they cannot breathe, therefore, their practicability is low.

In recent years, there has been a strong desire to minimize the amount of unnecessary electromagnetic radiation emitted by electronic equipment. The conventional electromagnetic shielding products on the market are mainly comprised of a stainless steel mesh on a textile backing having an adhesive layer. The stainless steel mesh, held on only by the adhesive layer, can easily detach from the textile backing. Therefore, conventional electromagnetic shielding products are not very durable.

To overcome the shortcomings, the present invention provides an electromagnetic shielding device to obviate or mitigate the aforementioned problems.

SUMMARY OF THE INVENTION

The primary objective of the present invention is to provide an electromagnetic shielding device that has a small volume and can be used in various forms.

To achieve the objective, an electromagnetic shielding device in accordance with the present invention has a bottom layer, a shielding layer and a top layer. The shielding layer is mounted between the bottom layer and the top layer and is made of metal filaments and textile fibers. The metal filaments and the textile fibers of the shielding layer are blending and formed into a mesh. The electromagnetic shielding device in the present invention can be made into patches or forms of various shapes and sizes and adhered to electrical or electronic equipment or adapted for use in clothing.

Other objectives, advantages and novel features of the invention will become more apparent from the following detailed description when taken in conjunction with the accompanying drawings.

BRIEF DESCRIPTION OF THE DRAWINGS

FIG. 2A is a top view in partial section of the electromagnetic shielding device in FIG. 1;

FIG. 2B is an enlarged top view of the shielding layer of electromagnetic shielding device in FIG. 2A;

FIG. 2C is a cross-sectional view of a strand of the shielding layer in FIG. 2B;

DETAILED DESCRIPTION OF THE INVENTION

Figure 1:
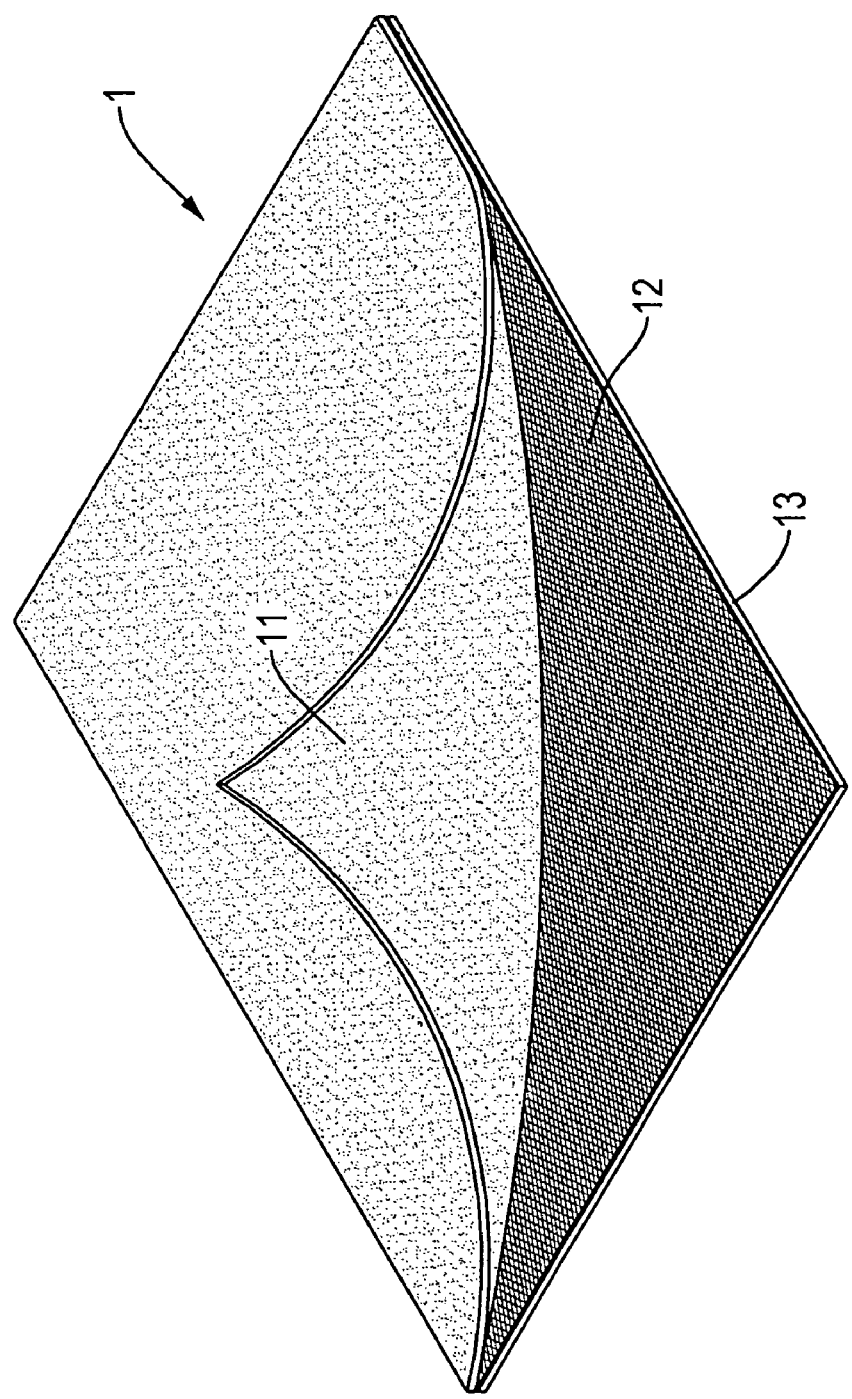
FIG. 1 is a perspective view of an electromagnetic shielding device in accordance with the present invention.

With reference to FIGS. 1, 2A, 2B and 2C, an electromagnetic shielding device (1) in accordance with the present invention has a top layer (11), a shielding layer (12) and a bottom layer (13).

The bottom layer (13) may be made of a plastic material, textile or artificial membrane and has a top surface, a bottom surface and an adhesive layer. The plastic material may be a plastic membrane, nylon, PVC, PU, rubber, tape or the like. The textile may be cotton, silk or the like. The adhesive layer is mounted on the bottom surface of the bottom layer.

The shielding layer (12) is mounted on the top surface of the bottom layer (13) and is made of metal filaments (121) and textile fibers (122). The metal filaments (121) and the textile fibers (122) are blended and formed into a mesh or a cloth with multiple quadrilateral cells. The metal filaments (121) may be of any kind of metal. In a preferred embodiment, stainless steel is preferred. The textile fibers (122) may be any kind of textile fiber. In a preferred embodiment, cotton fiber is preferred.

The top layer (11) is mounted on the shielding layer (12) and may be made of plastic material, textile or artificial membrane. The material of the top layer (11) may also be the same as that of the bottom layer (13).

Figure 3:
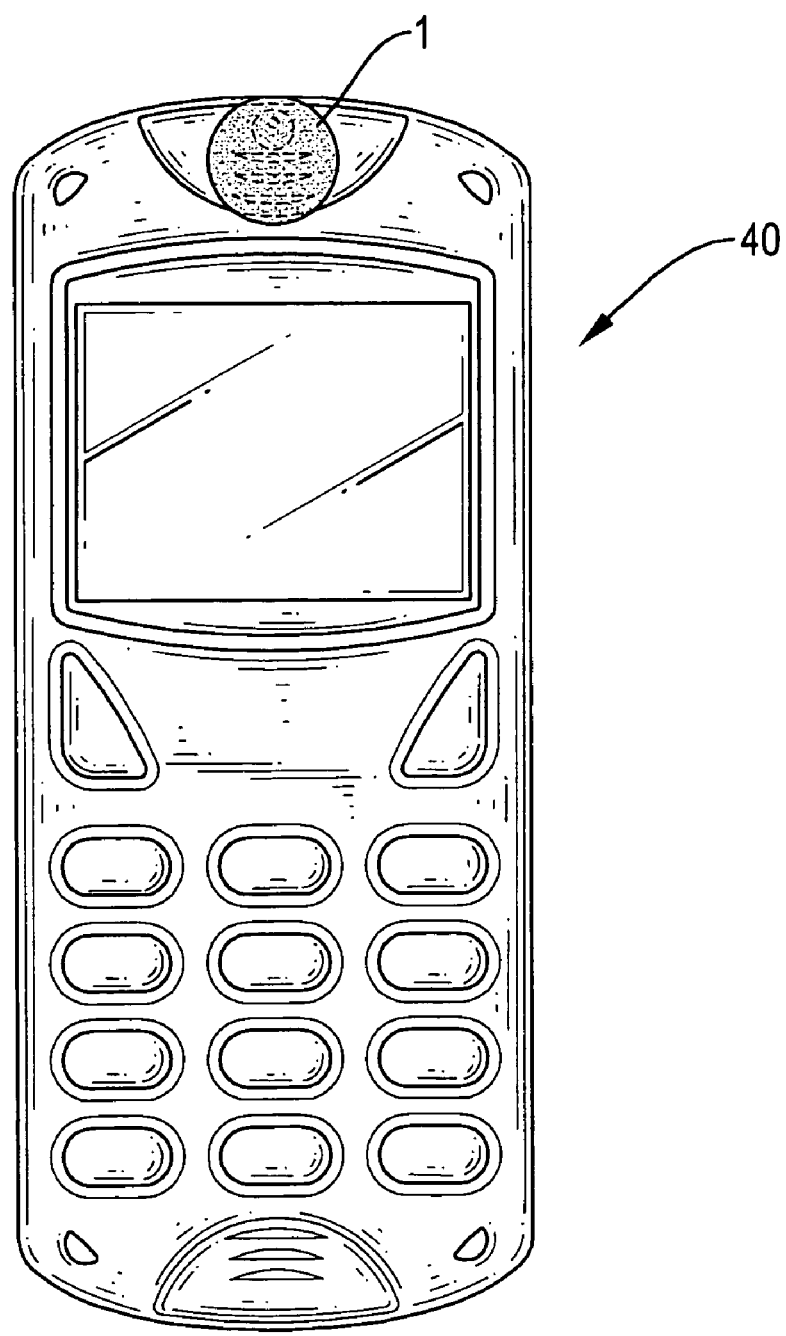
FIG. 3 is an operational front view of the electromagnetic shielding device in accordance with the present invention adapted for a mobile phone.

With reference to FIG. 3, the electromagnetic shielding device (1) is mounted on a mobile phone (40). The electromagnetic shielding device (1) may be made into a patch or a form that can be adhered to the mobile phone (40). The patch or form made from the electromagnetic shield device (1) may be mounted to completely cover the mobile phone (40) or partially cover the mobile phone (40) as shown in FIG. 3. The shielding layer (12) may also be mounted directly inside the case of the mobile phone (40). Patches or forms made of the electromagnetic shielding device (1) can be adapted for use in a computer mouse, a desk lamp or the like.

Figure 4:
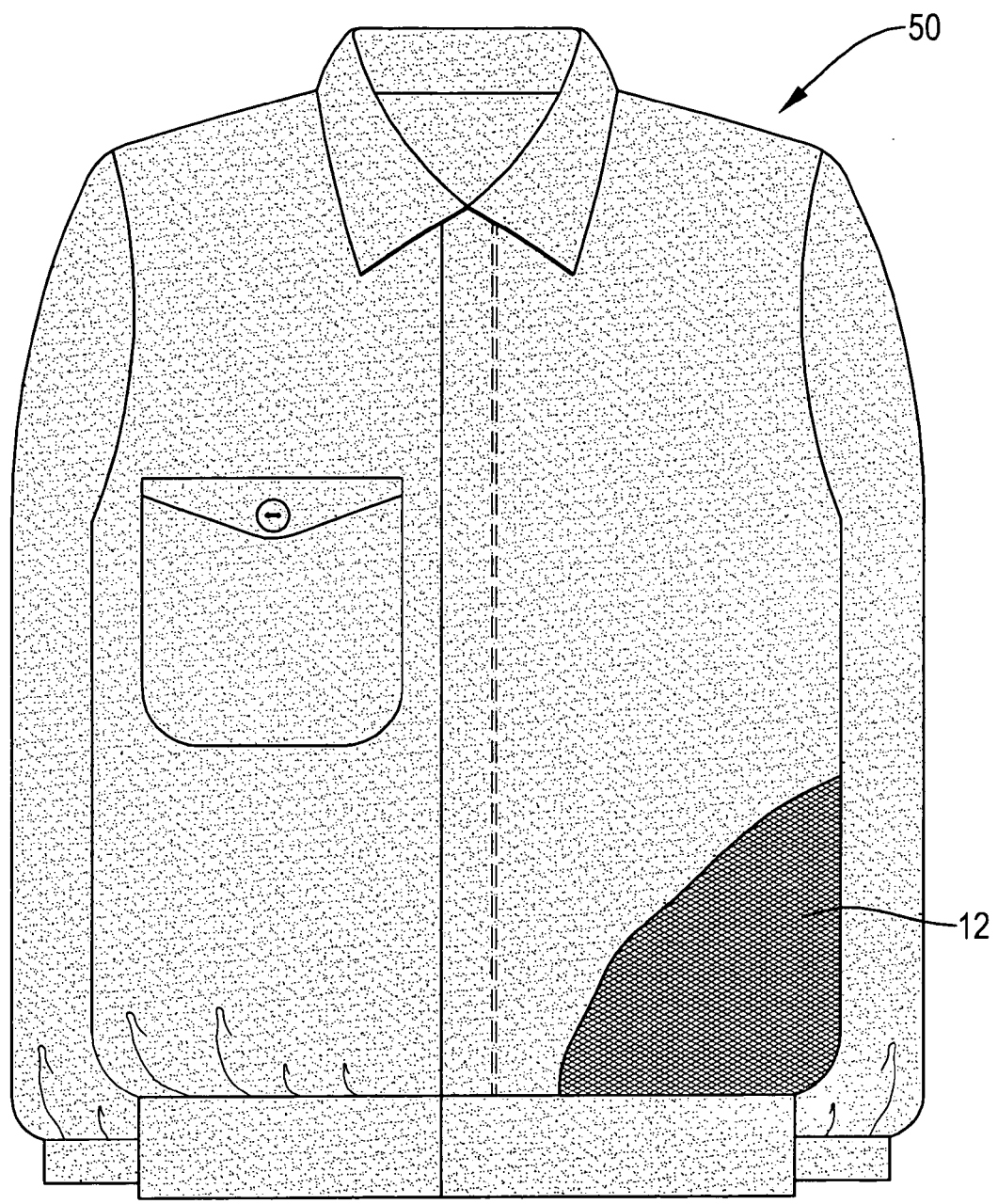
FIG. 4 is an operational front view in partial section of the electromagnetic shielding device in accordance with the present invention adapted for clothing.

With reference to FIG. 4, the electromagnetic shielding device (1) may be further adapted for use in clothing, such as an apron, or as a cover for an electrical or electronic product.

Figure 5:
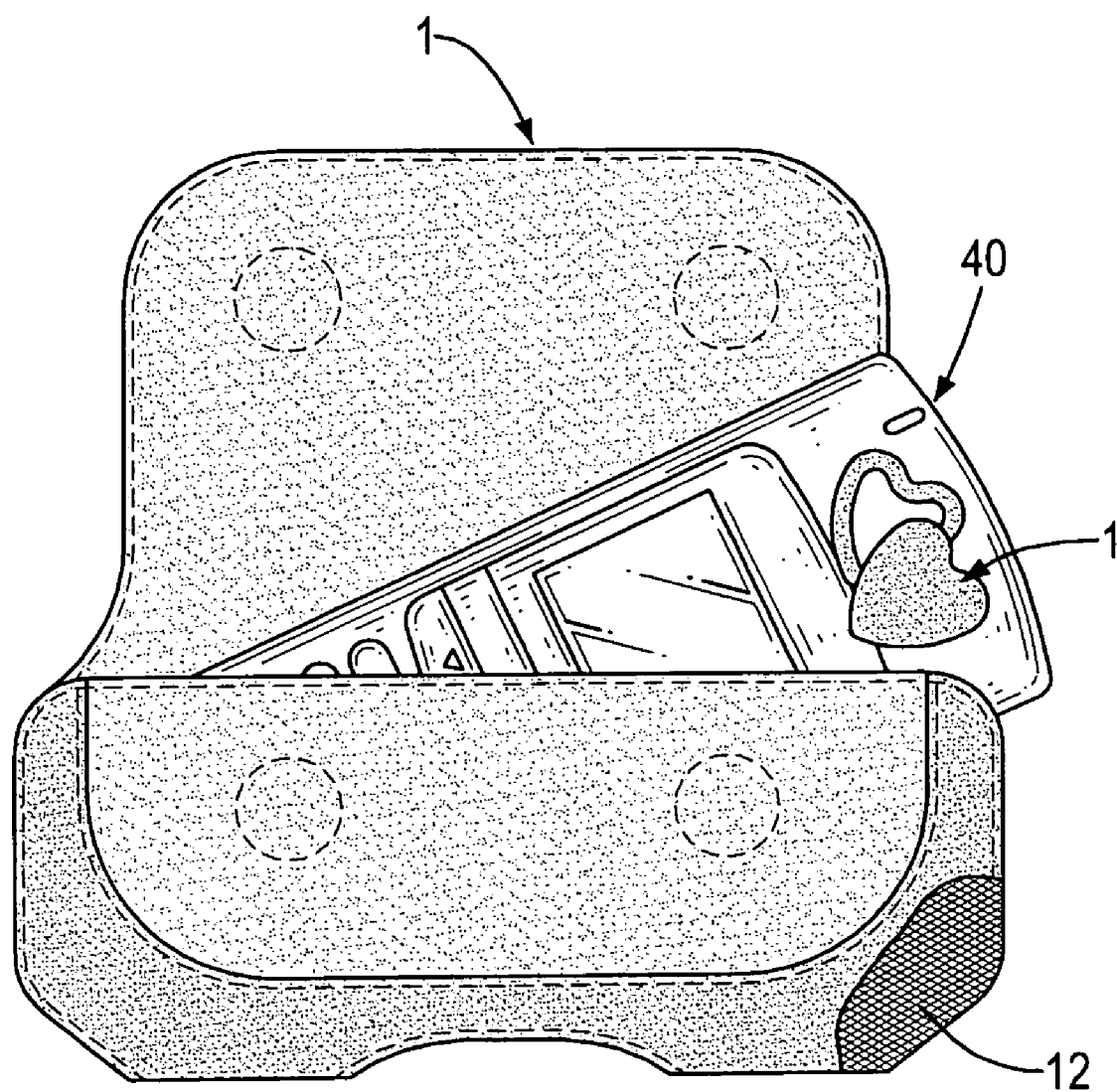
FIG. 5 is an operational front view of the electromagnetic shielding device in accordance with the present invention adapted for coating of a cellular phone.

With reference to FIG. 5, the electromagnetic shielding device (1) may be further adapted for use in coating of cellular phone.

Electric current can be divided into direct current (DC) and alternating current (AC). When the electromagnetic shielding device (1) in accordance with the present invention is used for shielding alternating current (AC), a ground wire is connected to the electromagnetic shield device (1) to dissipate the effects of the electromagnetic waves.

The electromagnetic shielding device has the following advantages.

1. The metal filaments provides a shielded function, so the metal filaments blending into the electromagnetic shielding device can prevent the electromagnetic waves emitting from the electrical equipment.

2. The structure of the present invention is very simple, so a simple process can be used to make the electromagnetic shielding device.

3. The electromagnetic shielding device may be formed into clothing, such as a coat, so it can provide a person with complete protection.

4. The shielding layer may be mounted directly inside the case of electrical or electronic equipment to provide shielding.

5. The electromagnetic shielding device may be made into a cover for furniture, such as a metal chair, to prevent static electricity, especially in winter.

6. The electromagnetic shielding device may be made into a separate cover or case for a mobile phone. People can carry and use their mobile phones in the cover or case and be protected from the electromagnetic waves.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An electromagnetic shielding device comprising:
   a bottom layer having
      a top surface, and
      a bottom surface;
   a shielding layer mounted on the top surface of the bottom layer composed of
      metal filaments, and
      textile fibers blended with the metal filaments and formed into a cloth with multiple quadrilateral cells; and
   a top layer mounted on the shielding layer.

2. The electromagnetic shielding device as claimed in claim 1, wherein the bottom layer is made of one of the group consisting of plastic material, textile and artificial membrane.

3. The electromagnetic shielding device as claimed in claim 2, wherein the top layer is made of one of the group consisting of plastic material, textile and artificial membrane.

4. The electromagnetic shielding device as claimed in claim 1, wherein the bottom layer further comprises an adhesive layer mounted on the bottom surface of the bottom layer.

5. The electromagnetic shielding device as claimed in claim 1, wherein the top is made of one of the group consisting of plastic material, textile and artificial membrane.

* * * * *